US012651967B2

(12) United States Patent
Li et al.

(10) Patent No.: US 12,651,967 B2
(45) Date of Patent: Jun. 9, 2026

(54) DETECTING OUTPUT INDUCTOR OPENED FOR BUCK CONVERTER

(71) Applicant: MEDIATEK INC., Hsin-Chu (TW)

(72) Inventors: Chih-Chen Li, Hsinchu City (TW); Jin-Yan Syu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 242 days.

(21) Appl. No.: 18/407,478

(22) Filed: Jan. 9, 2024

(65) Prior Publication Data

US 2024/0393411 A1      Nov. 28, 2024

Related U.S. Application Data

(60) Provisional application No. 63/503,498, filed on May 22, 2023.

(51) Int. Cl.
H02M 3/158      (2006.01)
G01R 31/70      (2020.01)

(52) U.S. Cl.
CPC ............. H02M 3/158 (2013.01); G01R 31/70 (2020.01)

(58) Field of Classification Search
CPC ......... H02M 3/155–1588; G01R 31/40; G01R 31/70; G01R 31/71; G01R 31/72
See application file for complete search history.

(56) References Cited

U.S. PATENT DOCUMENTS

| | | | | |
|---|---|---|---|---|
| 9,804,617 | B2 * | 10/2017 | Turkewadikar .... | G01R 33/0023 |
| 10,505,441 | B2 * | 12/2019 | Hsieh ..................... | H02M 1/36 |
| 10,897,203 | B2 * | 1/2021 | Bogue ................... | H02M 3/158 |
| 2009/0309559 | A1 * | 12/2009 | Xia ........................... | G05F 1/56 |
| | | | | 323/265 |
| 2012/0161732 | A1 * | 6/2012 | Renton ................. | H02M 3/156 |
| | | | | 323/275 |
| 2013/0021012 | A1 * | 1/2013 | Oddoart ................ | H02M 3/156 |
| | | | | 323/282 |
| 2016/0172973 | A1 * | 6/2016 | Rince .................... | H02M 3/158 |
| | | | | 323/271 |
| 2017/0160756 | A1 * | 6/2017 | Hsieh .................... | H02M 3/155 |
| 2020/0350817 | A1 | 11/2020 | De | |
| 2024/0313637 | A1 * | 9/2024 | Mansri ................... | H02M 1/32 |

FOREIGN PATENT DOCUMENTS

| | | |
|---|---|---|
| EP | 4 138 290 A1 | 2/2023 |
| TW | 201134072 A1 | 10/2011 |
| TW | I635683 B | 9/2018 |
| TW | I697187 B | 6/2020 |

* cited by examiner

*Primary Examiner* — Fred E Finch, III
(74) *Attorney, Agent, or Firm* — Winston Hsu

(57) ABSTRACT

A buck converter includes a first transistor, a second transistor, an inductor and a capacitor. The first transistor, the second transistor and the inductor are coupled to a switching node. A method includes charging the switching node for a predetermined duration using a first charging current, detecting a voltage at the switching node to obtain a first detection voltage, and determining the connection status of the inductor according to at least the first detection voltage.

16 Claims, 6 Drawing Sheets

The charging current charges the switching node for the predetermined duration ～S42

The voltage detector detects the voltage at the switching node to obtain the detection voltage ～S44

Determine the connection status of the inductor according to the detection voltage ～S46

DETECTING OUTPUT INDUCTOR OPENED FOR BUCK CONVERTER

CROSS REFERENCE TO RELATED APPLICATIONS

This application claims the benefit of U.S. Provisional Application No. 63/503,498, filed on May 22, 2023. The content of the application is incorporated herein by reference.

BACKGROUND

A buck converter can also be referred to as a step-down converter. The buck converter is a DC-to-DC (direct current to direct current) converter used to step down a voltage from its input to its output, and utilizes an inductor as an energy storage element. The inductor plays an important role in the buck converter. In the prior art, without a detector to detect if an inductor is open circuited, when the inductor is defective or the inductor is not soldered well on the printed circuit board (PCB), it will take time and effort to debug.

SUMMARY

According to an embodiment of the invention, a method is provided for detecting a connection status of an inductor of a buck converter. The buck converter comprises a first transistor, a second transistor, the inductor and a capacitor. The first transistor, the second transistor and the inductor are coupled to a switching node. The method comprises charging the switching node for a predetermined duration using a first charging current, detecting a voltage at the switching node to obtain a first detection voltage, and determining the connection status of the inductor according to at least the first detection voltage.

According to another embodiment of the invention, a buck converter comprises a first transistor, a second transistor, an inductor, a capacitor, a current generator and a voltage detector. The first transistor comprises a first terminal configured to receive an input voltage, and a second terminal coupled to a switching node. The second transistor comprises a first terminal coupled to the switching node, and a second terminal coupled to a ground. The inductor comprises a first terminal coupled to the switching node, and a second terminal configured to output an outputting voltage. The capacitor comprises a first terminal coupled to the second terminal of the inductor, and a second terminal coupled to the ground. The current generator is configured to provide a first charging current and charge the switching node using a first charging current for a predetermined duration. The voltage detector is configured to detect a voltage at the switching node to obtain a first detection voltage, and determine a connection status of the inductor according to at least the first detection voltage.

According to another embodiment of the invention, a connectivity testing circuit for detecting a connection status of an inductor of a buck converter. The buck converter comprises a first transistor, a second transistor, the inductor and a capacitor, the first transistor, the second transistor and the inductor being coupled to a switching node. The connectivity testing circuit comprises a current generator and a voltage detector. The current generator is configured to provide a first charging current and charge the switching node using a first charging current for a predetermined duration. The voltage detector is configured to detect a voltage at the switching node to obtain a first detection voltage, and determine a connection status of the inductor according to at least the first detection voltage.

The method, the buck converter and the connectivity testing circuit in the present invention are used to detect the connection status of an inductor of a buck converter. By detecting the connection status of an inductor of a buck converter, the connection status of the inductor can be easily determined and debugging time can be saved.

These and other objectives of the present invention will no doubt become obvious to those of ordinary skill in the art after reading the following detailed description of the preferred embodiment that is illustrated in the various figures and drawings.

DETAILED DESCRIPTION

Figures 1, 2:
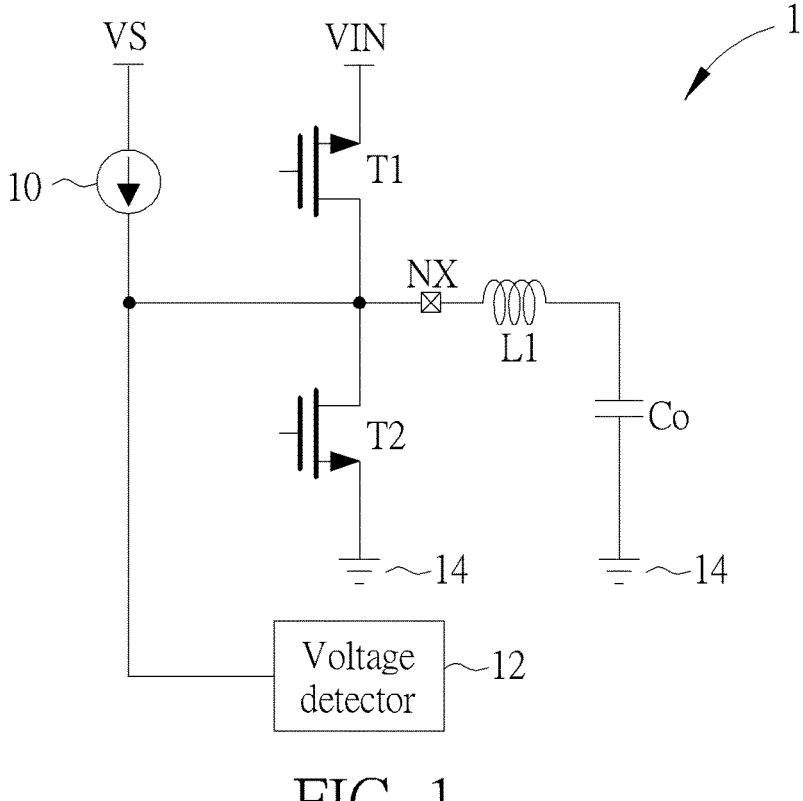
FIG. 1 is a buck converter according to an embodiment of the invention.
FIG. 2 shows the buck converter in FIG. 1 for detecting a connection status of an inductor in a normal case.

A buck converter typically contains at least two transistors and at least one energy storage element. The energy storage element can be a combination of an inductor (i.e., output inductor of the buck converter) and a capacitor (i.e., output capacitor of the buck converter). FIG. 1 is a buck converter 1 according to an embodiment of the invention. It is well known that the buck converter is used to generate an outputting voltage according to an input voltage which is higher than the outputting voltage, therefore, in the exemplary embodiments of the present invention, only the components related to the present invention are illustrated, and it should be understood by those skilled in the art that the common structure not shown. For example, as shown in FIG. 1, the buck converter 1 comprises a first transistor T1, a second transistor T2, an inductor L1 and a capacitor Co, however, those skilled in the art should understand: the control terminals of the transistors T1 and T2 may be controlled by a driver circuit, thus controlled by driver signals to be turned on or off, in order to generate the expected outputting voltage according to the input voltage. Since the focus of this invention is on how to detect the connection status of the inductor in the buck convertor, the description of other conventional structures (for example, the driver circuit) irrelevant to the purpose of this invention in the buck converter is omitted. In the embodiment, the buck converter 1 may further comprise a detection circuit, which is configured to detect or determine the connection status of the inductor, such as normal or abnormal. As shown in FIG. 1, the detection circuit comprises a current generator 10 and a voltage detector 12. The first transistor T1 comprises a first terminal configured to receive an input voltage VIN, and a second terminal coupled to a switching node NX. The second transistor T2 comprises a first terminal coupled to the switching node NX, and a second terminal coupled to ground 14. The inductor L1 comprises a first terminal coupled to the switching node NX, and a second terminal for outputting an outputting voltage Vout. The inductor L1 may be soldered to the switching node NX. The capacitor Co comprises a first terminal coupled to the second terminal of the inductor L1, and a second terminal coupled to the ground 14. The current generator 10 is configured to generate at least one current, to selectively charge the switching node NX, as shown in FIG. 1, the current generator 10 comprises a first terminal coupled to a supply voltage VS, which is higher than a voltage threshold (for example, the voltage threshold is about 1V) and may be same or different with the input voltage VIN, and a second terminal coupled to the switching node NX. It is noted that if the voltage is higher than the voltage threshold, it can be judged as logic high (1), otherwise, it can be judged as logic low (0). The voltage detector 12 is configured to detect a voltage at the switching node NX and determine a connection status of the inductor L1 according to the detected voltage, in FIG. 1, the voltage detector 12 comprises a first terminal coupled to the switching node NX and an output terminal for outputting a signal indicating a connection status of the inductor L1. In FIG. 1, the current generator 10 may be a current source, which is configured to provide a current to the switching node NX for a predetermined duration when needed (for example, the detection circuit/operation is triggered). In one embodiment, if the detection voltage exceeds the voltage threshold, for example, during the switching node NX is charged by the charging current for the predetermined duration, it may be determined that the connection status of the inductor is abnormal. In another embodiment, if the detection voltage is always less than the voltage threshold, for example, during the switching node NX is charged by the charging current for the predetermined duration, it may be determined that the connection status of the inductor is normal. In the embodiment, it is noted that the value of the charging current is at least related to the capacitance of the capacitor Co and the predetermined duration. Under a fixed predetermined duration, the higher the capacitance of the capacitor Co, the higher the upper limit of the charging current, and conversely, the lower the capacitance of the capacitor Co, the lower the upper limit of the charging current. When the predetermined duration and the capacitance of the capacitor Co are known, the upper limit of the charging current can be determined as a current threshold in the normal case, such that when the charging current greater than the current threshold is used to charge the node NX for the predetermined duration, the voltage of node NX will be higher than the voltage threshold, and when the charging current less than the current threshold is used to charge the node NX for the predetermined duration, the voltage of node NX will be lower than the voltage threshold. That is, the charging current provided by the current generator 10 to the node NX is smaller than the predetermined current threshold.

FIG. 2 shows the buck converter 1 for detecting the connection status of the inductor L1 for a normal case. To detect the connection status of the inductor L1, the current generator 10 is controlled to charge the switching node NX using a charging current Ic for a predetermined duration. The voltage detector 12 detects a detection voltage at the switching node NX during the predetermined duration when the charging current Ic charges the switching node NX, and determines the connection status of the inductor L1 according to the detection voltage. The voltage detector 12 detecting the voltage at the switching node NX is performed during the predetermined duration when the charging current Ic charges the switching node NX. In a normal case, that is the inductor L1 is connected well to the switching node NX, since the big capacitor Co (The capacitance value is at the microfarad (uF) level) is coupled to the second end of the inductor L1 and the capacitor Co can accumulates electric charges, hence, the voltage at the switching node NX may ramp up with a low slew rate and the detection voltage may be less than a voltage threshold. For example, when the detection voltage is always less than a voltage threshold during the switching node NX is charged by the charging current, the connection status of the inductor L1 is determined as normal, i.e., being connected well.

Figures 3, 4:
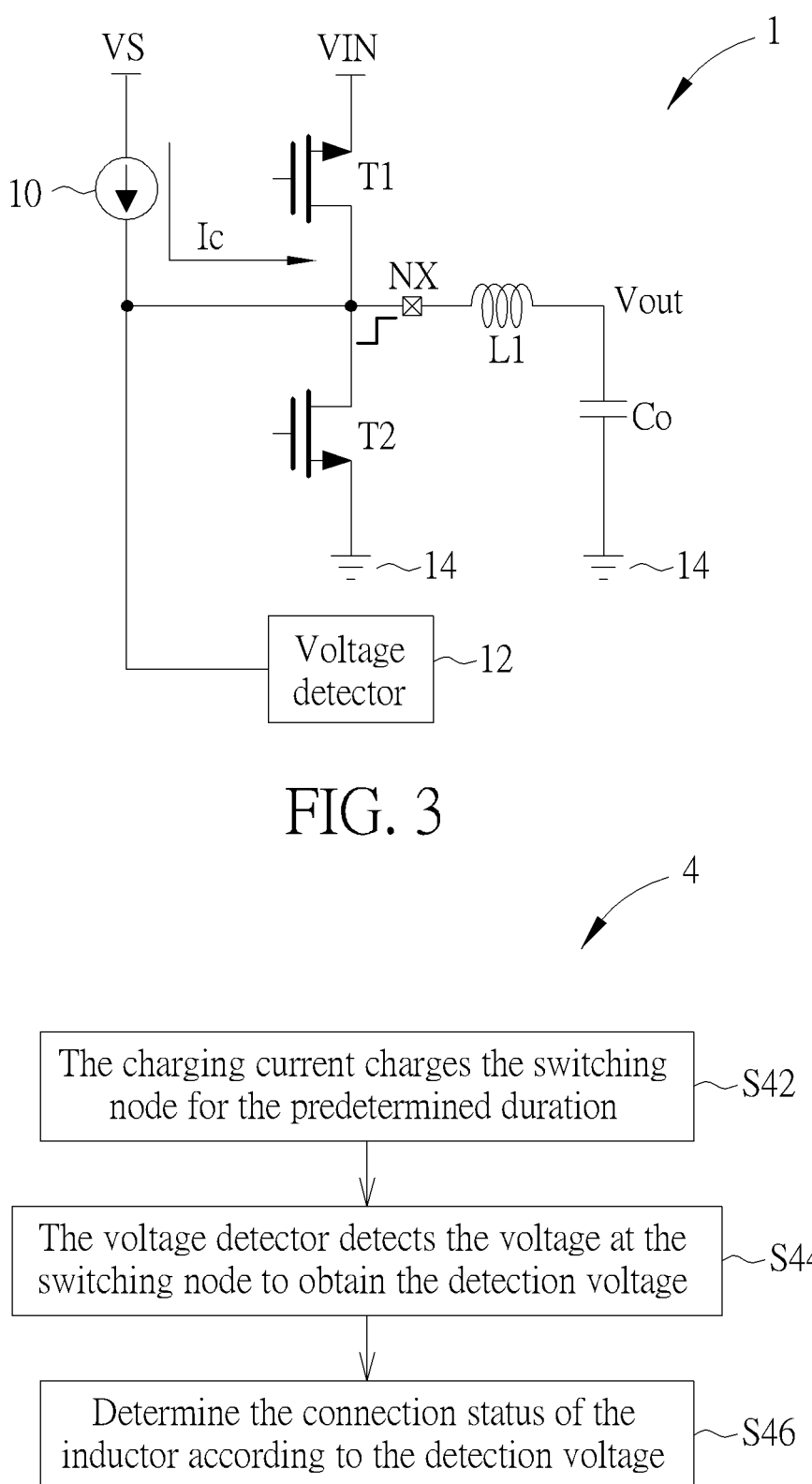
FIG. 3 shows the buck converter in FIG. 1 for detecting a connection status of an inductor in an abnormal case.
FIG. 4 is a method for detecting the connection status of the inductor of the buck converter in FIG. 1.

FIG. 3 shows the buck converter 1 for detecting a connection status of the inductor L1 for an abnormal case. To detect the connection status of the inductor L1, the current generator 10 is controlled to use a charging current Ic to charge the switching node NX for the predetermined duration. The voltage detector 12 detects the detection voltage at the switching node NX during the predetermined duration when the charging current Ic charges the switching node NX. In an abnormal case, for example, when the inductor L1 is disconnected (abnormal) to the switching node NX or the inductor L1 is defect, the charging current Ic cannot flow to the capacitor Co and accumulates electric charges on the capacitor Co. On the other hand, due to the small parasitic capacitance on the transistors T1 and T2 which is at the picofarad (pF) level, i.e., much less than the capacitance value of capacitor Co, the voltage at the switching node NX may ramp up with a high slew rate, for example, immediately rising to the supply voltage VS, hence the detection voltage may exceed the voltage threshold. When the detection voltage exceeds the threshold, the connection status of the inductor L1 is determined as abnormal, such as being abnormal.

FIG. 4 is a method 40 for detecting the connection status of the inductor L1 of the buck converter 1. The method 40 comprises the following steps:

Step S42: the charging current Ic charges the switching node NX for the predetermined duration;

Step S44: the voltage detector 12 detects the voltage at the switching node NX to obtain the detection voltage; and Step S46: determine the connection status of the inductor L1 according to the detection voltage.

Figure 5:
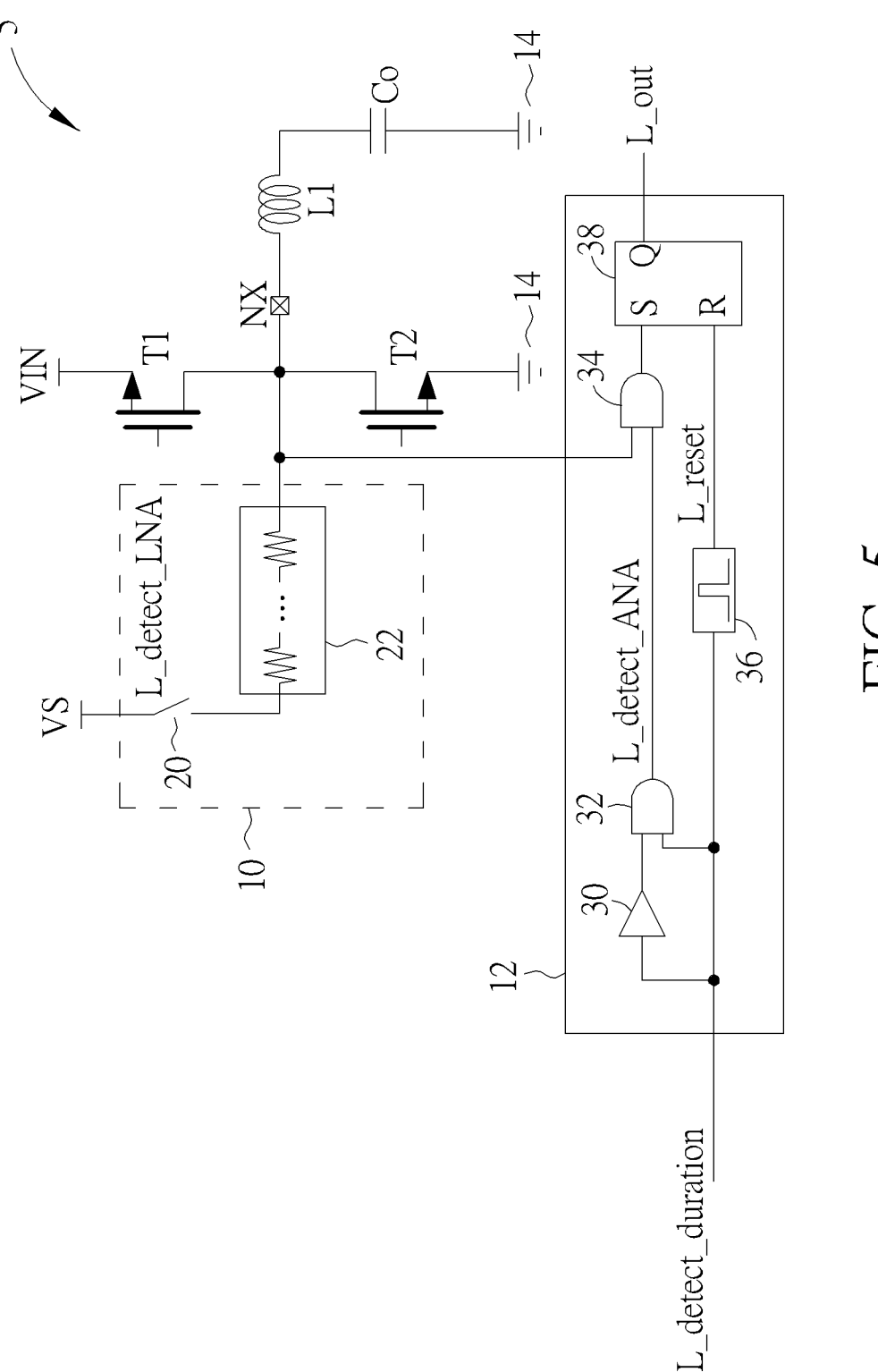
FIG. 5 is a buck converter according to another embodiment of the invention.

FIG. 5 is a buck converter 5 according to another embodiment of the invention. In FIG. 5, the voltage detector 12 comprises a delay cell 30, a first AND gate 32, a second AND gate 34, a pulse generator 36 (such as, a one shot generator) and a latch 38 (such as, a SR latch). The delay cell 30 is configured to introduce a preset delay and comprises an input terminal configured to receive a start pulse used to trigger the detection of inductor connection state, and an output terminal. The first AND gate 32 comprises a first input terminal coupled to the output terminal of the delay cell 30, a second input terminal configured to receive the start pulse, and an output terminal. The second AND gate 34 comprises a first input terminal coupled to the switching node NX, a second input terminal coupled to the output terminal of the first AND gate 32, and an output terminal. The pulse generator 36 is configured to generate a reset pulse with a fixed duration/width according to the start pulse and comprises an input terminal configured to receive the start pulse, and an output terminal. In the embodiment, the reset pulse is used to reset the latch 38 to 0, and the preset delay provided by the delay cell 30 is longer than the fixed duration of the reset pulse, to ensure that the latch 38 has been reset before node NX is charged. The latch 38 comprises a first input terminal (labeled as "S") coupled to the output terminal of the second AND gate 34, a second input terminal (labeled as "R") coupled to the output terminal of the pulse generator 36, and an output terminal (labeled as "Q"). The latch 38 may be an SR latch. The first input terminal of the latch 38 may be a set terminal. The second input terminal of the latch 38 may be a reset terminal.

As shown in FIG. 5, the current generator 10 comprises a switch 20 and a current limiter 22, however, the present invention is not limited to this. The switch 20 comprises a first terminal configured to receive the supply voltage VS, a second terminal, and a control terminal coupled to the output terminal of the first AND gate 32. The current limiter 22 comprises a first terminal coupled to the second terminal of the switch 20, and a second terminal coupled to the switching node NX.

Figure 6:
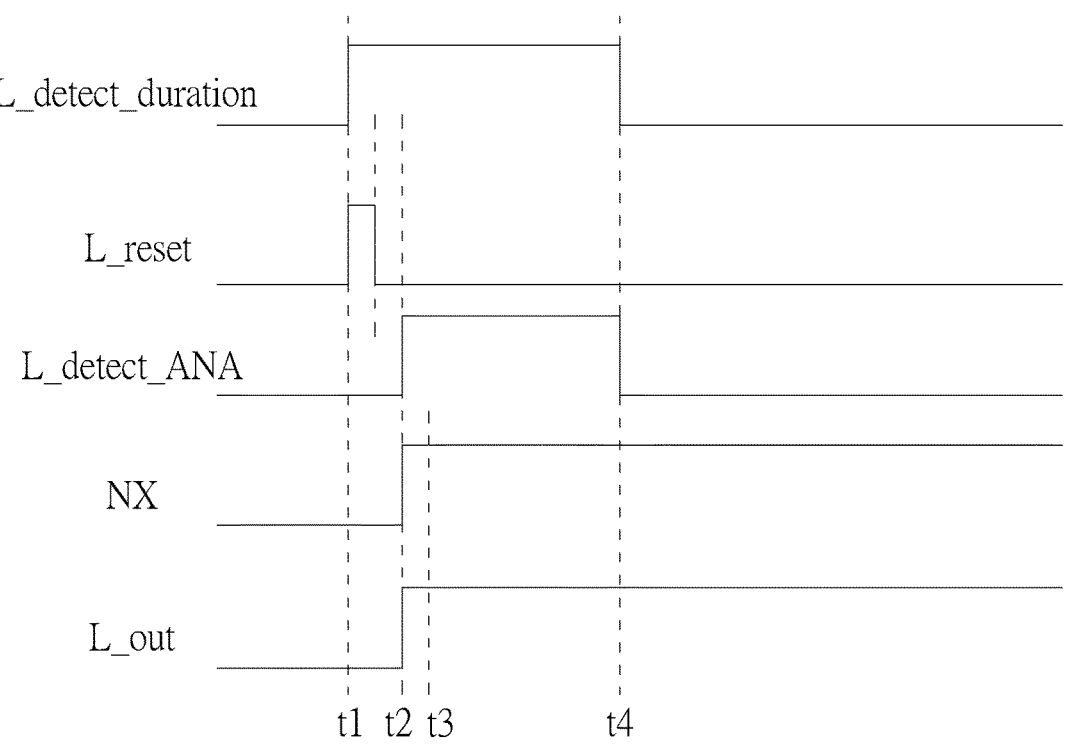
FIG. 6 is a timing diagram of the buck converter in FIG. 5.

FIG. 6 is a timing diagram of the buck converter 5. The voltage detector 12 determines the connection status of the inductor L1 according to the detection voltage. At time t1, a high voltage of the start pulse L_detect_duration is inputted to the input terminal of the delay cell 30, the second input terminal of the first AND gate 32, and the input terminal of the pulse generator 36. The pulse generator 36 generates a reset pulse L_reset upon receiving the start pulse L_detect_duration to reset the latch 38. For example, pulse generator 36 generates a reset pulse L_reset with a predetermined duration/width when detecting the rising edge of the start pulse. In addition, the delay unit 30 introduces a preset delay for the start pulse, for example, the preset delay equals to t2-t1. Hence, at time t2, the first AND gate 32 outputs a control signal L_detect_ANA to the control terminal of the switch 20 to turn on the switch 20, and the control signal L_detect_ANA is also outputted to the second input terminal of the second AND gate 34. The supply voltage VS starts to charge the switching node NX through the switch 20 and the current limiter 22, that is the current generator 10 provides a current to charge the switch node NX for a predetermined duration which equals to the pulse width of the control signal L_detect_ANA. If the inductor L1 is abnormal to the switching node NX, such as failing to properly soldered to the switching node NX or the inductor L1 being defective, the switching node NX will be pulled to the supply voltage VS abruptly, because of the parasitic capacitance being very small, and the latch 38 outputs a high voltage (logic 1 or high) immediately, indicating the connection status of the inductor is abnormal. If the inductor L1 is connected well to the switching node NX, such as being soldered well to the switching node NX, the switching node NX will be rised very slowly due to the output capacitor Co is very large relatively to the parasitic capacitance, hence the voltage at the switching node NX will not exceed the voltage threshold and the latch 38 outputs a low voltage (logic 0 or low), which indicates the connection status of the inductor is normal. As shown in the timing diagram, the switching node NX is abruptly pulled to the supply voltage VS, thus it can be determined that the connection status of the inductor L1 is abnormal, for example, the inductor L1 may be abnormal to the switching node NX. Specifically, at time t3, when the detection voltage at the switching node NX reaches the voltage threshold, the second AND gate 34 outputs to high and sets the latch 38 to output a high voltage which indicates the connection status of the inductor L1 is abnormal. At time t4, the start pulse L_detect_duration drops to a low voltage.

The low voltage is inputted to the second input terminal of the first AND gate 32, thus the signal L_detect_ANA outputted by the first AND gate 32 turns off the switch 20, meanwhile, the second AND gate 34 outputs to low regardless of the node voltage. Since both of the first input terminal and the second input terminal of the latch 38 are low, the output L out of the latch 38 is remained. It should be understood that when the latch 38 receives a next reset pulse L_reset from the pulse generator 36, the latch is reset again.

The current limiter 22 comprises a plurality of resistors for limiting the current flowing therethrough less than the current threshold described above. If the current flowing therethrough exceeds a current threshold, the connection status of the inductor L1 may be mistakenly detected. Hence, the current should be less than the predetermined current threshold as described above.

Figure 7:
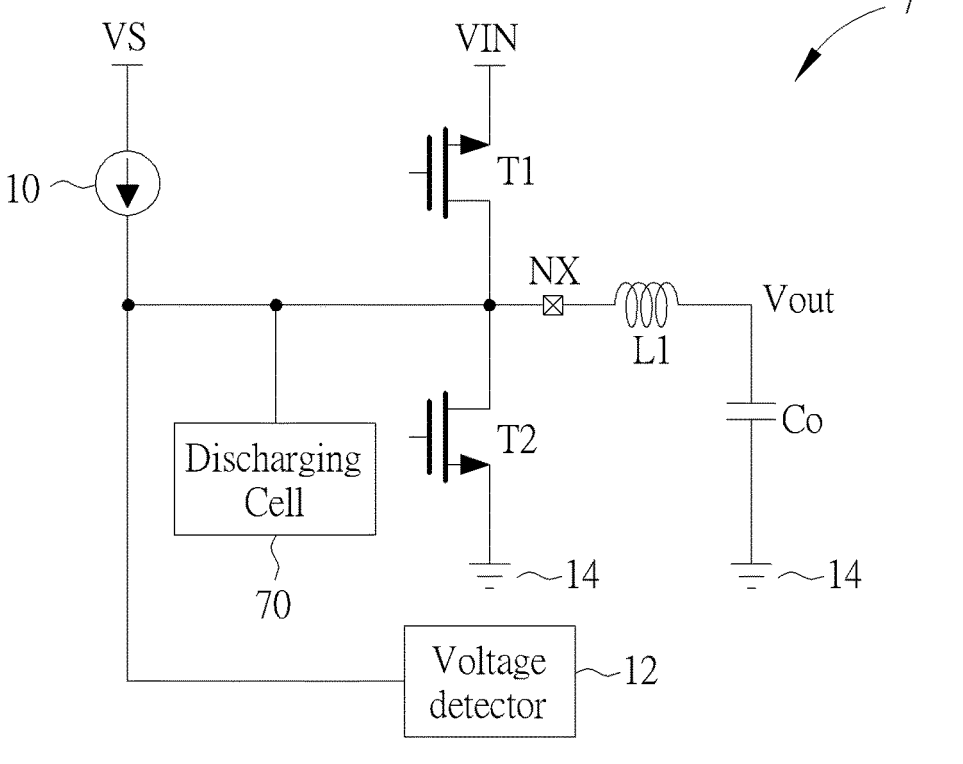
FIG. 7 is a buck converter according to another embodiment of the invention.

FIG. 7 is a buck converter 7 according to another embodiment of the invention. If the inductor L1 is connected well to the switching node NX and the capacitor Co has some remaining charges, the detection results may be inaccurate. Since there are charges in the capacitor Co, the remaining energy capacity of the capacitor Co is limited, when using a small current to charge the switching node NX for a predetermined duration, the switching node NX may ramp up with a higher slew rate and may be mistakenly detected as abnormal. To avoid false detection, a discharge cell 70 is used to discharge the capacitor Co before charging the switching node NX or out of the predetermined duration. The discharge cell 70 is coupled to the first end of the inductor L1 while the capacitor Co is coupled to the second end of the inductor L1.

Figure 8:
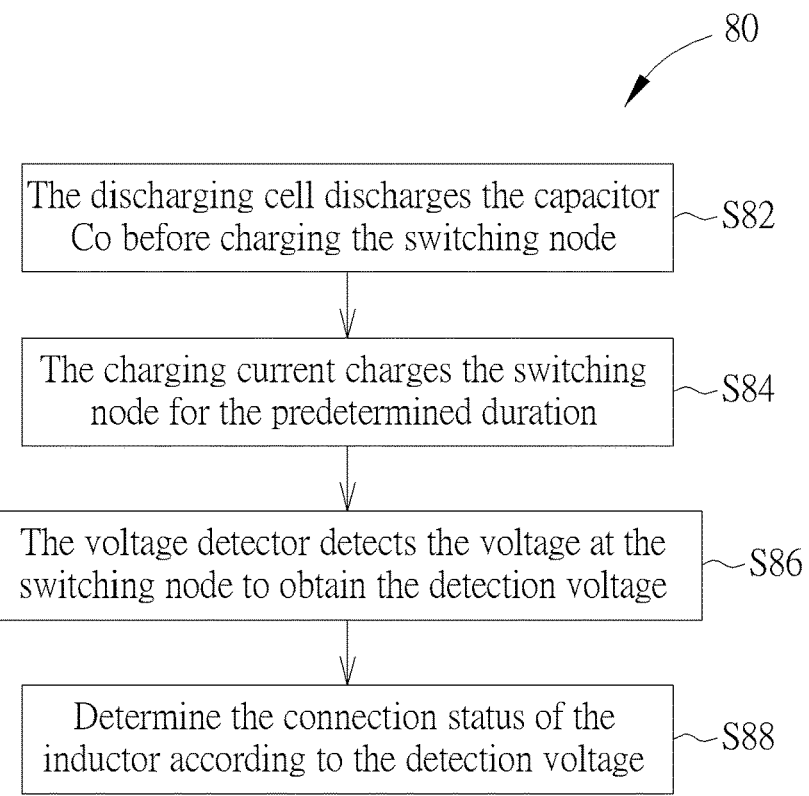
FIG. 8 is a method for detecting the connection status of the inductor of the buck converter in FIG. 7.

FIG. 8 is a method 80 for detecting the connection status of the inductor L1 of the buck converter 7. The method 80 comprises the following steps:

Step S82: the discharging cell 70 discharges the capacitor Co before charging the switching node NX;

Step S84: the charging current Ic charges the switching node NX for the predetermined duration;

Step S86: the voltage detector 12 detects the voltage at the switching node NX to obtain the detection voltage; and Step S88: determine the connection status of the inductor L1 according to the detection voltage.

Figure 9:
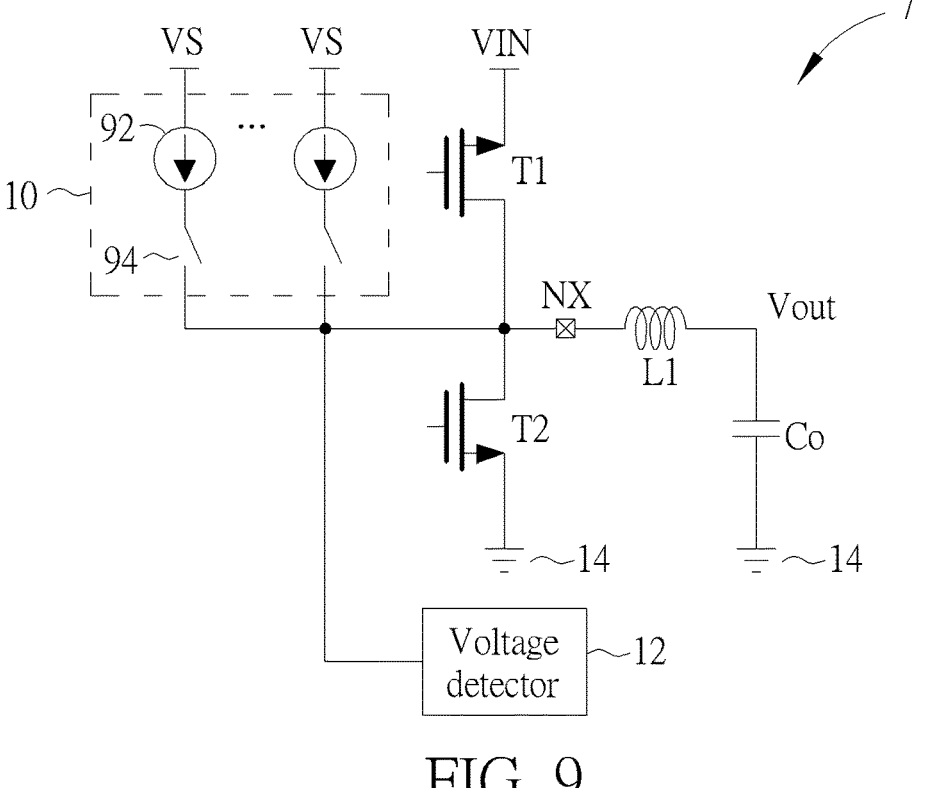
FIG. 9 is a buck converter according to another embodiment of the invention.

FIG. 9 is a buck converter 9 according to another embodiment of the invention. If the inductor L1 is not connected well (for example, partially soldered or partially connected) or disconnected to the switching node NX and/or a very small current is used to detect the connection status of the inductor L1, the connection status might be mistakenly detected. To avoid false detection, a current generator 90 can be utilized to generate N candidate currents, N being a positive integer. In one example, the current generator 90 comprises N current sources 92 configured to generate the N candidate currents and controlled by N switches, and N switches 94. Each switch 94 comprises a control terminal controlled to turn on or off the corresponding switch, to selectively turn on or off the corresponding current source of the N current sources, a first terminal coupled to a corresponding current source of the N current sources 92, a second terminal coupled to the switching node NX. A controller may be coupled to the control terminal and configured to control the N switches to select a first set or a second set of currents from the N candidate currents.

The first set of currents from the N candidate currents is selected to generate a first charging current to charge the switching node NX for a predetermined duration to generate a first detection voltage. The second set of currents from the N candidate currents is selected to generate a second charging current to charge the switching node NX for the predetermined duration to generate a second detection voltage. The first set of currents or the second set of currents may be the complete set of N candidate currents. The second charging current is different from the first charging current. The voltage detector 12 detects the voltage at the switching node NX to obtain the first and second detection voltages, and determines the connection status of the inductor L1 according to the first detection voltage and the second detection voltage. When the first detection voltage and the second detection voltage are less than a threshold, the connection status of the inductor L1 is determined as connected well. When the first detection voltage and/or the second detection voltage exceed the threshold, the connection status of the inductor L1 is determined as abnormal. By using multiple different currents to detect the connection status, false detection can be avoided when the inductor L1 is not completely connected.

Figure 10:
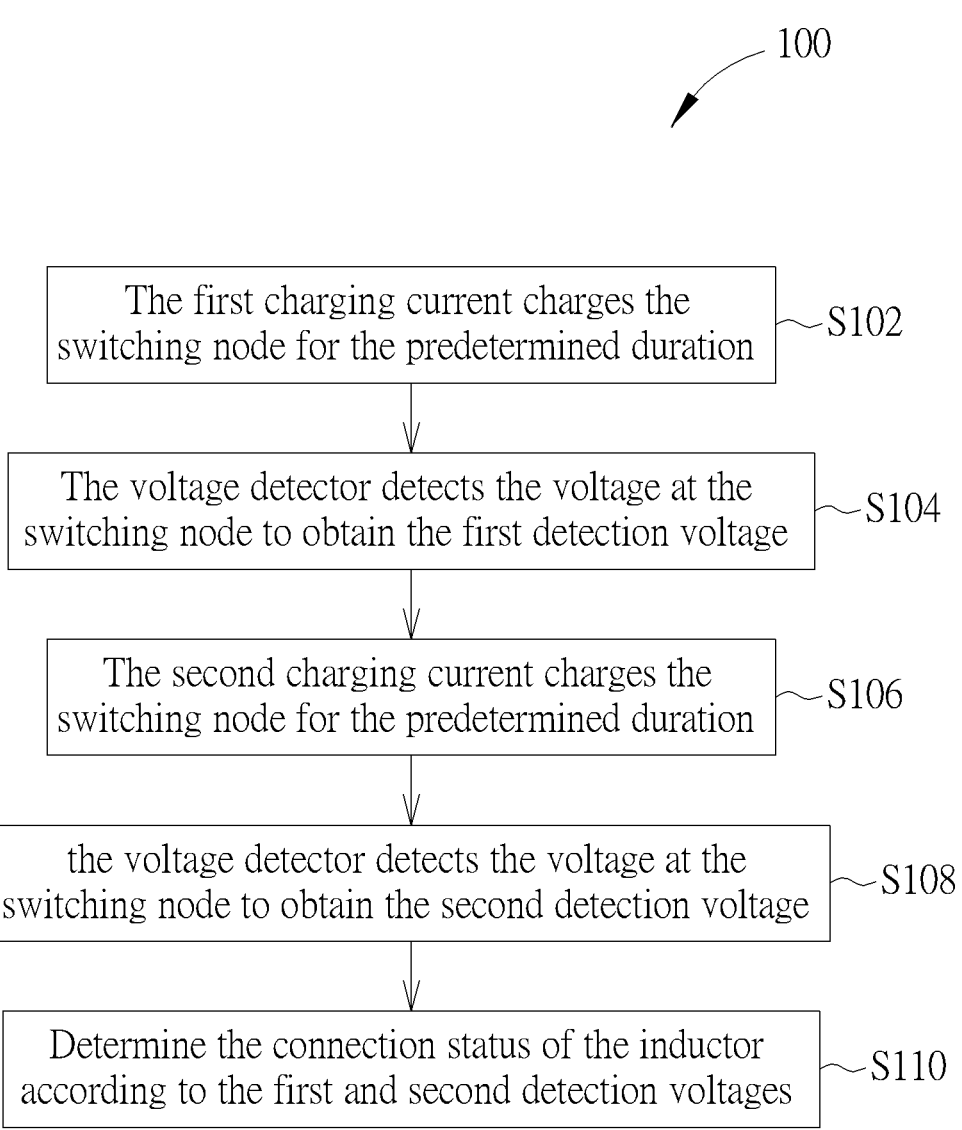
FIG. 10 is a method for detecting the connection status of the inductor of the buck converter in FIG. 9.

FIG. 10 is a method 100 for detecting the connection status of the inductor L1 of the buck converter 9. The method 100 comprises the following steps:

Step S102: the first charging current charges the switching node NX for the predetermined duration;

Step S104: the voltage detector 12 detects the voltage at the switching node NX to obtain the first detection voltage;

Step S106: the second charging current charges the switching node NX for the predetermined duration;

Step S108: the voltage detector 12 detects the voltage at the switching node NX to obtain the second detection voltage; and Step S110: determine the connection status of the inductor according to the first and second detection voltages.

The method and the apparatus in the present invention are used to detect the connection status of an inductor of a buck converter. By detecting the connection status of an inductor of a buck converter, the connection status of the inductor can be easily determined and debugging time can be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for detecting a connection status of an inductor of a buck converter, the buck converter comprising a first transistor, a second transistor, the inductor and a capacitor, the first transistor, the second transistor and the inductor being coupled to a switching node, the capacitor coupled to the switching node through the inductor, the method comprising:

charging the switching node for a predetermined duration using a first charging current;

detecting a voltage at the switching node to obtain a first detection voltage; and determining the connection status of the inductor according to at least the first detection voltage;

wherein determining the connection status of the inductor according to at least the first detection voltage comprises:

when the first detection voltage is less than a voltage threshold during the predetermined duration, determining that the connection status of the inductor is normal; or

when the first detection voltage exceeds a voltage threshold during the predetermined duration, determining that the connection status of the inductor is abnormal.

2. The method of claim 1, further comprising: discharging the capacitor outside the predetermined duration.

3. The method of claim 2, further comprising:

charging the switching node using a second charging current for the predetermined duration, the second charging current being different from the first charging current; and detecting the voltage at the switching node during the switching node is charged by the second charging current for the predetermined duration to obtain a second detection voltage;

wherein determining the connection status of the inductor according to at least the first detection voltage comprises:

determining the connection status of the inductor according to the first detection voltage and the second detection voltage;

when the first detection voltage and the second detection voltage are less than a voltage threshold during the predetermined duration, determining that the connection status of the inductor is normal; and when the first detection voltage and the second detection voltage exceeds the voltage threshold during the predetermined duration, determining that the connection status of the inductor is abnormal.

4. The method of claim 1, further comprising:

charging the switching node using a second charging current bigger than the first charging current for the predetermined duration; and detecting the voltage at the switching node during the switching node is charged by the second charging current, to obtain a second detection voltage;

wherein when the second detection voltage is less than the voltage threshold during the switching node is charged by the second charging current for the predetermined duration, the connection status of the inductor is determined to be normal; and when the second detection voltage exceeds the voltage threshold during the switching node is charged by the second charging current for the predetermined duration, the connection status of the inductor is determined to be abnormal.

5. The method of claim 1, wherein:

the first charging current is less than a predetermined current threshold;

wherein the predetermined current threshold is determined according to the voltage threshold, a capacitance of the capacitor and the predetermined duration.

6. The method of claim 1, wherein:

the first detection voltage at the switching node is obtained during the predetermined duration.

7. A buck converter comprising:

a first transistor comprising a first terminal configured to receive an input voltage, and a second terminal coupled to a switching node;

a second transistor comprising a first terminal coupled to the switching node, and a second terminal coupled to a ground;

an inductor comprising a first terminal coupled to the switching node, and a second terminal configured to output an outputting voltage;

a capacitor comprising a first terminal coupled to the second terminal of the inductor, and a second terminal coupled to the ground;

a current generator configured to provide a first charging current and charge the switching node using the first charging current for a predetermined duration; and a voltage detector configured to detect a voltage at the switching node to obtain a first detection voltage, and determine a connection status of the inductor according to at least the first detection voltage;

wherein determining the connection status of the inductor according to at least the first detection voltage comprises:

when the first detection voltage is less than a voltage threshold during the predetermined duration, the voltage detector is configured to determine that the connection status of the inductor is normal; or when the first detection voltage exceeds a voltage threshold during the predetermined duration, the voltage detector is configured to determine that the connection status of the inductor is abnormal.

8. The buck converter of claim 7, wherein the voltage detector comprises:

a delay cell comprising an input terminal configured to receive a start pulse, and an output terminal, configured to introduce a preset delay;

a first AND gate comprising a first input terminal coupled to the output terminal of the delay cell, a second input terminal configured to receive the start pulse, and an output terminal;

a second AND gate comprising a first input terminal coupled to the switching node, a second input terminal coupled to the output terminal of the first AND gate, and an output terminal;

a pulse generator comprising an input terminal configured to receive the start pulse, and an output terminal, configured to generate a reset pulse with a fixed duration according to the start pulse, wherein the preset delay is longer than the fixed duration; and a latch comprising a set input terminal coupled to the output terminal of the second AND gate, a reset input terminal coupled to the output terminal of the pulse generator, and an output terminal.

9. The buck converter of claim 8, wherein the current generator comprises:

a switch comprising a first terminal configured to receive a supply voltage, a second terminal, and a control terminal coupled to the output terminal of the first AND gate; and a current limiter comprising a first terminal coupled to the second terminal of the switch, and a second terminal coupled to the switching node.

10. The buck converter of claim 7, further comprising a discharging cell coupled to the switching node, and configured to discharge the capacitor before charging the switching node or outside the predetermined duration.

11. The buck converter of claim 2, further comprising:

a second charging current bigger than the first charging current configured to charge the switching node for the predetermined duration; and the voltage detector configured to detect the voltage at the switching node during the switching node is charged by the second charging current to obtain a second detection voltage.

12. The buck converter of claim 7, wherein:

the first charging current is less than a predetermined current threshold;

wherein the predetermined current threshold is determined according to the voltage threshold, a capacitance of the capacitor and the predetermined duration.

13. The buck converter of claim 7, wherein the current generator is configured to generate N candidate currents, and the first charging current is derived from the N candidate currents, N being a positive integer.

14. The buck converter of claim 13, wherein the current generator comprises:

N current sources configured to generate the N candidate currents and controlled by N switches;

each switch of the N switches comprising:

a control terminal controlled to turn on or off a corresponding switch, to selectively turn on or off a corresponding current source of the N current sources;

a first terminal coupled to a corresponding current source of the N current sources; and a second terminal coupled to the switching node.

15. The buck converter of claim 13, wherein the current generator is further configured to generate a second charging current, the second charging current being different from the first charging current, and charge the switching node using the second charging current for the predetermined duration; and the voltage detector is further configured to detect the voltage at the switching node during the switching node is charged by the second charging current for the predetermined duration to obtain a second detection voltage, and determine the connection status of the inductor according to the first detection voltage and the second detection voltage.

16. A connectivity testing circuit for detecting a connection status of an inductor of a buck converter, the buck converter comprising a first transistor, a second transistor, the inductor and a capacitor, the first transistor, the second transistor and the inductor being coupled to a switching node, the connectivity testing circuit comprising:

a current generator configured to provide a first charging current and charge the switching node using a first charging current for a predetermined duration; and a voltage detector configured to detect a voltage at the switching node to obtain a first detection voltage, and determine a connection status of the inductor according to at least the first detection voltage;

wherein determining the connection status of the inductor according to at least the first detection voltage comprises:

when the first detection voltage is less than a voltage threshold during the predetermined duration, the voltage detector is configured to determine that the connection status of the inductor is normal; or when the first detection voltage exceeds a voltage threshold during the predetermined duration, the voltage detector is configured to determine that the connection status of the inductor is abnormal.

* * * * *